(12) United States Patent
Cheng et al.

(10) Patent No.: US 9,431,287 B2
(45) Date of Patent: Aug. 30, 2016

(54) CHEMICAL MECHANICAL PLANARIZATION PROCESS AND STRUCTURES

(71) Applicant: MACRONIX INTERNATIONAL CO., LTD., Hsinchu (TW)

(72) Inventors: Yi Sheng Cheng, Yongkang (TW); Chun Fu Chen, Taipei (TW); Yung Tai Hung, Chiayi (TW); Chin Ta Su, Yunlin Country (TW)

(73) Assignee: MACRONIX INTERNATIONAL CO., LTD. (TW)

(*) Notice: Subject to any disclaimer, the term of this patent is extended or adjusted under 35 U.S.C. 154(b) by 0 days.

(21) Appl. No.: 13/714,016

(22) Filed: Dec. 13, 2012

(65) Prior Publication Data

US 2014/0167208 A1    Jun. 19, 2014

(51) Int. Cl.
*H01L 29/06*       (2006.01)
*H01L 21/762*      (2006.01)
*H01L 21/28*       (2006.01)
*H01L 21/3105*     (2006.01)
*H01L 27/115*      (2006.01)

(52) U.S. Cl.
CPC .... *H01L 21/76224* (2013.01); *H01L 21/28052* (2013.01); *H01L 21/28123* (2013.01); *H01L 21/31053* (2013.01); *H01L 21/76232* (2013.01); *H01L 27/11531* (2013.01); *H01L 27/11573* (2013.01)

(58) Field of Classification Search
CPC .............................. H01L 29/06; H01L 21/762
USPC .................................... 438/588, 424; 257/506
See application file for complete search history.

(56) References Cited

U.S. PATENT DOCUMENTS

| | | | | |
|---|---|---|---|---|
| 6,001,721 A * | 12/1999 | Huang | | 438/597 |
| 2005/0056881 A1* | 3/2005 | Yeo et al. | | 257/315 |
| 2006/0145274 A1* | 7/2006 | Chidambarrao et al. | | 257/412 |
| 2009/0051008 A1* | 2/2009 | Shin et al. | | 257/536 |
| 2009/0191675 A1* | 7/2009 | Mehrad et al. | | 438/218 |
| 2009/0218632 A1* | 9/2009 | Cheng | | 257/369 |
| 2011/0171810 A1* | 7/2011 | Tseng et al. | | 438/382 |
| 2011/0303989 A1* | 12/2011 | Chuang et al. | | 257/380 |
| 2012/0119307 A1* | 5/2012 | Li et al. | | 257/410 |
| 2013/0214335 A1* | 8/2013 | Prindle et al. | | 257/288 |

* cited by examiner

*Primary Examiner* — Jerome Jackson, Jr.
*Assistant Examiner* — Lamont Koo
(74) *Attorney, Agent, or Firm* — Baker & McKenzie LLP

(57) ABSTRACT

A semiconductor device includes a substrate having a first and second region, a first structure and a second structure. The first structure is formed over the substrate in the first region. The first structure has a first height. The second structure is formed over the substrate in the second region. The second structure has a second height different from the first height.

21 Claims, 8 Drawing Sheets

CHEMICAL MECHANICAL PLANARIZATION PROCESS AND STRUCTURES

BACKGROUND

The present application relates generally to semiconductor devices and includes methods and structures for improving a chemical mechanical planarization (CMP) process, which may be used to prepare a region of a semiconductor device for silicide formation.

An important capability for manufacturing reliable integrated circuits is to prevent contact between two structures such that a short does not form. To achieve this isolation, trench structures, such as those used in Shallow Trench Isolation (STI), are formed. These trenches are filled with a dielectric and a CMP process is performed to flatten the surface of the semiconductor device in preparation for the formation of other structures. The CMP process stops when a surface such as a surface of a SiN layer, a mask layer or a substrate is reached however some of the dielectric material from the trenches continues to be removed. This phenomenon is an example of a dishing effect. Thus, structures that are formed over the filled in trenches will be at a lower height than those formed over the substrate, which leads to problems in subsequent processing steps.

BRIEF SUMMARY

In an embodiment, a semiconductor device includes a substrate having a first and second region, a first structure and a second structure. The first structure is formed over the substrate in the first region. The first structure has a first height. The second structure is formed over the substrate in the second region. The second structure has a second height different from the first height.

In another embodiment, a method of fabricating a semiconductor device includes providing a substrate including a first region and a second region; forming a first structure over the substrate in the first region, the first structure having a first height; and forming a second structure over the substrate in the second region, the second structure having a second height different from the first height.

DETAILED DESCRIPTION

Figure 1:
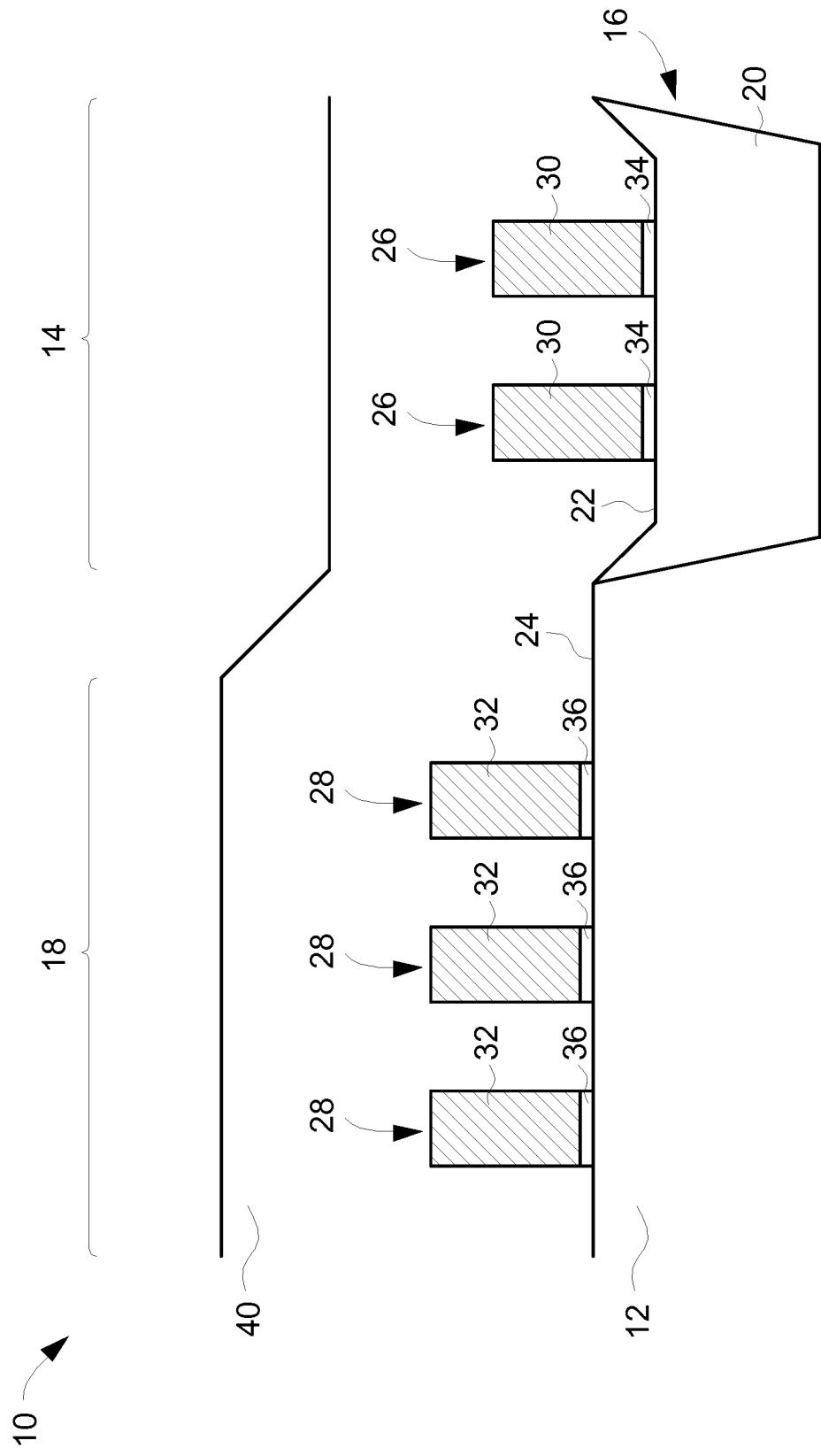
FIG. 1 is a cross-sectional view of an exemplary semiconductor device.

FIG. 1 shows a semiconductor device 10 including a substrate 12, which may be silicon. In a first region 14, the substrate 12 includes a trench 16. The trench 16 may be formed using an STI process. A second region 18 does not include a trench. The trench 16 is filled in with a dielectric 20, such as an oxide. A CMP process is then performed to flatten (i.e., planarization) the surface of the semiconductor device. Differences in the materials such as density, hardness, and properties affecting the CMP process cause a dishing effect, which removes excess material from the trench region. That is, an upper surface 22 of the dielectric 20 in the first region 14 corresponding with the trench 16 is lower than a surface 24 of the substrate 12 in the second region 18.

The trench 16 may be formed, for example, to provide isolation between an dense array region and a less dense periphery region of a memory device. To provide good isolation from the higher voltage signals that may be present in the periphery region, wide trenches may be provided. The wider a trench is, the greater the dishing effect will be.

Following the CMP process, the structures 26 are formed over the dielectric 20 in the first region 14 and the structures 28 are formed over the substrate 12 in the second region 18. The structures 26 and 28 may include polysilicon layers 30 and 32 formed over oxide layers 34 and 36 respectively. Oxide layers 34 and 36 may be gate oxide layers.

Following the formation of the structures 26 and 28, a dielectric layer 40 is formed over the structures 26 and 28.

Figure 2:
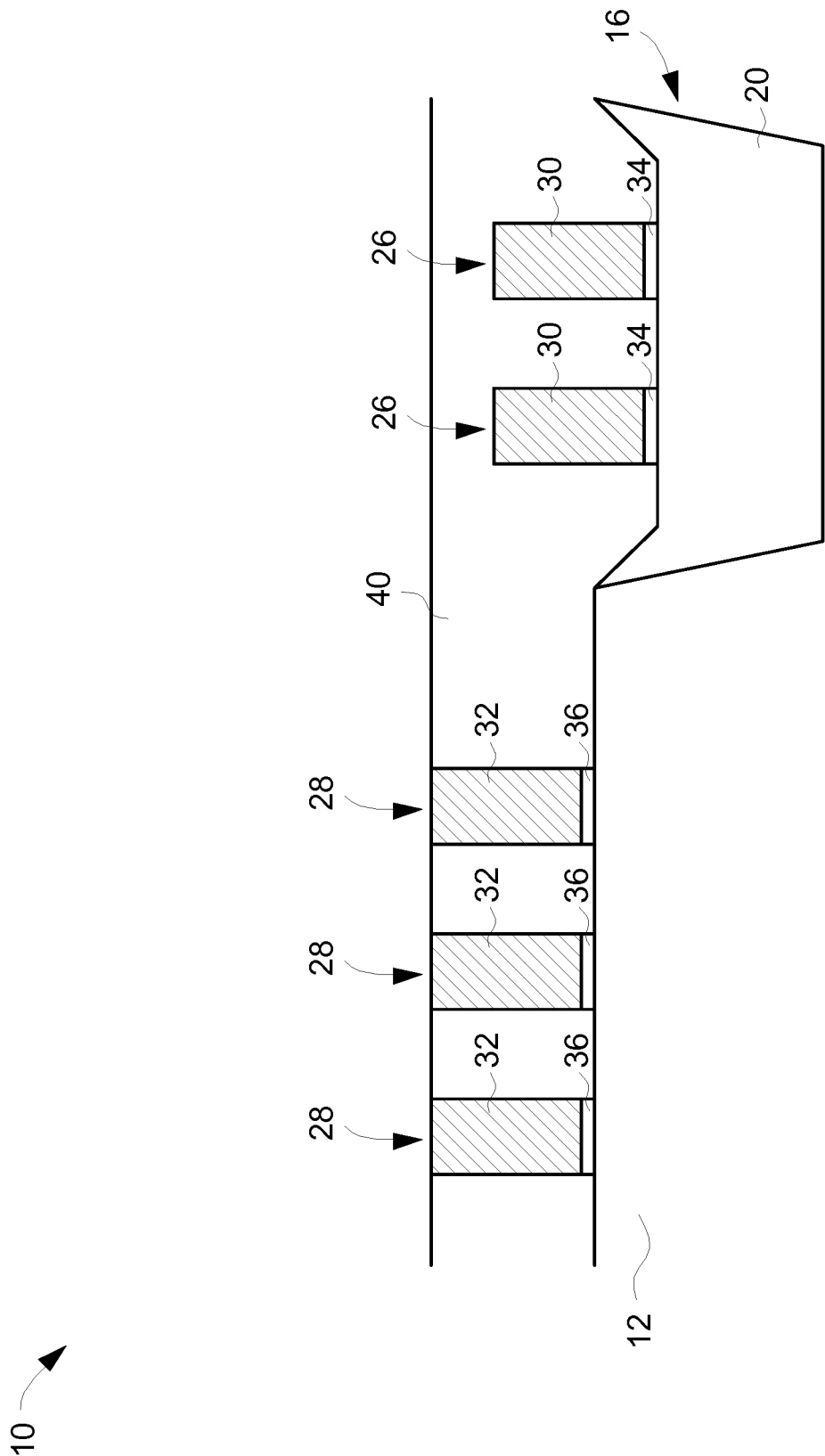
FIG. 2 is a cross-sectional view of an exemplary semiconductor device.

FIG. 2 shows the semiconductor device 10 of FIG. 1 after a CMP process has been performed to remove excess material from the dielectric layer 40. The CMP process is selective for polysilicon and stops when the polysilicon layers 32 of the structures 28 are exposed. The structures 26 remain covered by the dielectric layer 40 because they are offset at a lower position due to the dishing effect.

Figure 3:
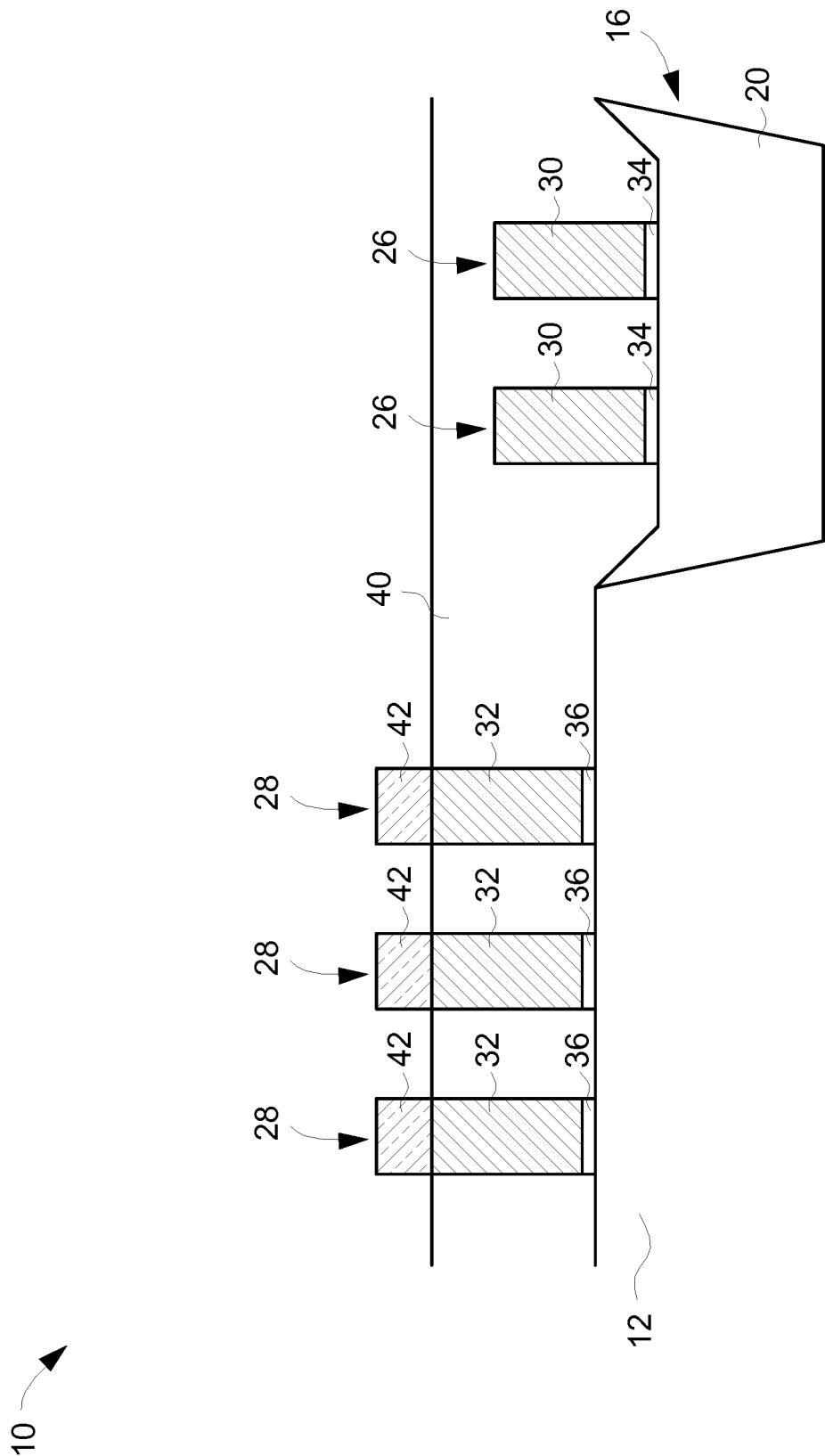
FIG. 3 is a cross-sectional view of an exemplary semiconductor device.

FIG. 3 shows the semiconductor device 10 of FIG. 2 after a silicide process has been performed. Silicide layers 42 are formed on the polysilicon layers 32 of the structures 28, which were exposed during the silicide process. The silicide layers may be grown on the polysilicon layers and part of the polysilicon layers may be consumed and changed to silicide as part of the silicide process.

However, no silicide was formed on the structures 26, which were covered by the dielectric layer 40 during the silicide process, leading to defects in the device. A mask and etch process may be used to expose the structures 26, however a top surface of the structures 26 and 28 would remain at different heights causing additional problems in subsequent processing steps. This approach also requires the additional processing steps to perform the masking and etching. Larger trenches, which may be used to provide increased isolation, lead to an increased dishing effect and an aggravation of this problem.

Figure 4:
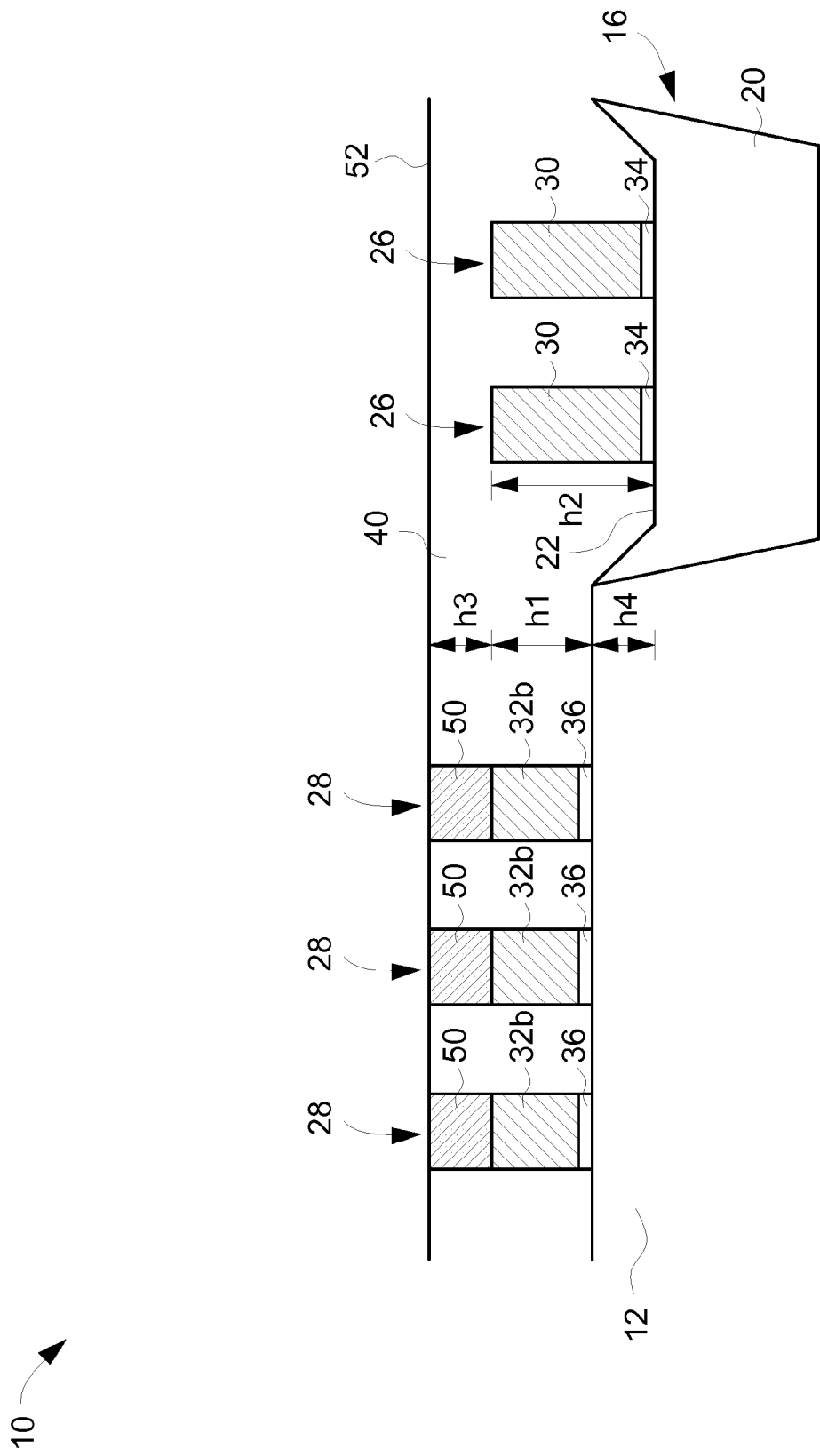
FIG. 4 is a cross-sectional view of an exemplary semiconductor device.

FIG. 4 shows the semiconductor device 10 of FIG. 2 after an oxidation process, such as an annealing. For example, an oxidation annealing may be performed using $O_2$ gas and a temperature approximately 1000 C. Plasma oxidation may also be used. The oxidization process oxidizes the exposed polysilicon layers 32 of the structures 28 to form the silicon oxide 50 in the structures 28. The portion of the polysilicon layers 32 processed into oxide (i.e., the height of the silicon oxide 50), can be controlled by controlling various process parameters such as temperature, duration, etc. The portion of the polysilicon layers 32 that is not changed to oxide remains as the polysilicon layers 32b.

For example, if a height of the structures 28 above the substrate 12 is h1 and a height of the structures 26 above the upper surface 22 of the dielectric 20 is h2, then the ratio of the heights h2/h1 may be approximately 1.1 to 1.5 in some embodiments. In this example, the thickness of the polysilicon oxide 50 may be up to 50% of the height h2. In some embodiments, a height h3 of the silicon oxide 50 is approximately the same as a height h4 of the dishing effect. The height of the dishing effect is approximately equal to an average height-wise distance between the upper surface 22 of the dielectric 20 and the substrate 12 in the region 18 across the trench 16. Preferably, a top of the polysilicon layers 32b and a top of the polysilicon layers 30 are approximately the same distance from the surface 52 of the dielectric layer 40. However, they are not required to be exactly the same.

Figure 5:
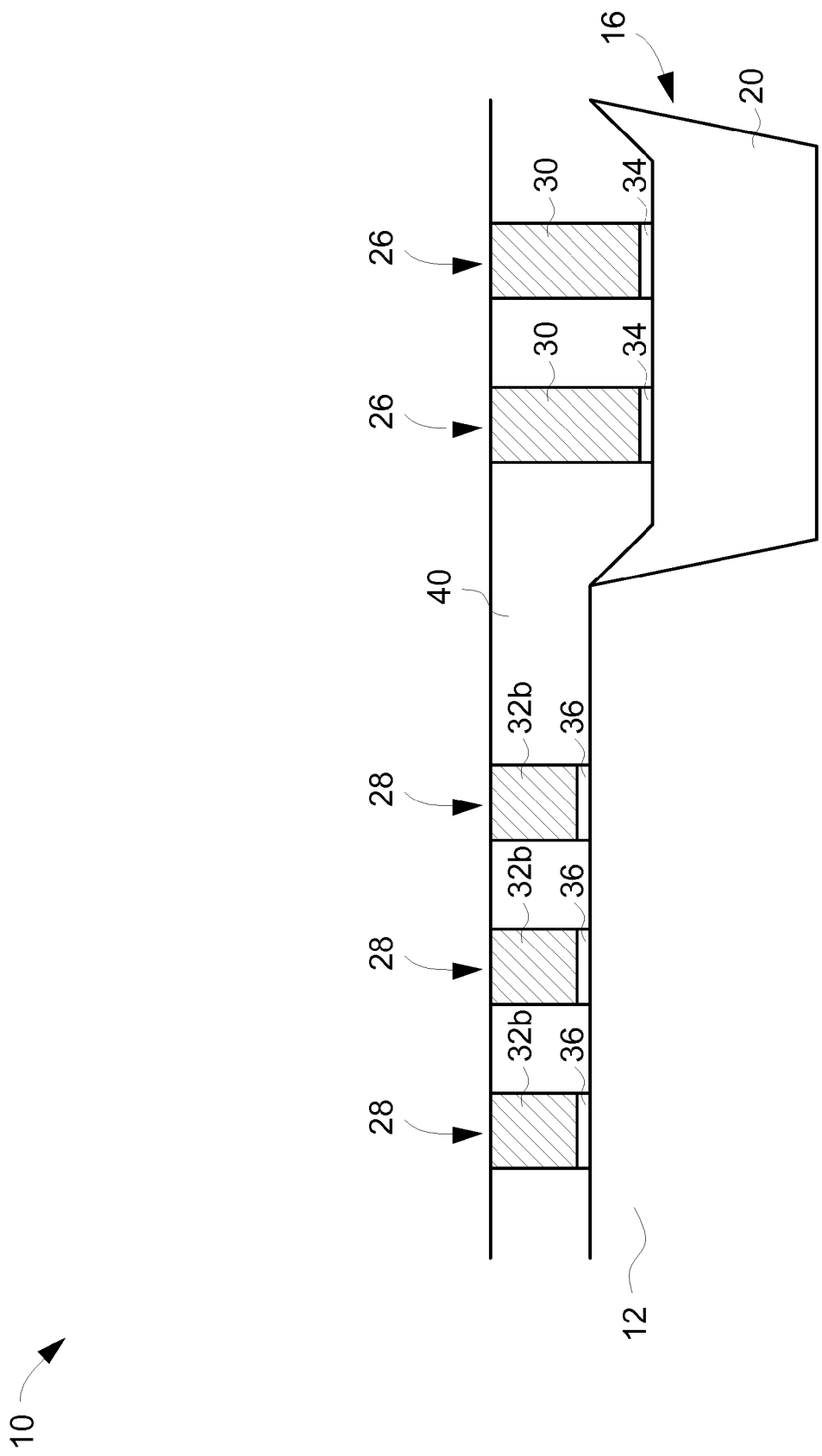
FIG. 5 is a cross-sectional view of an exemplary semiconductor device.

FIG. 5 shows the semiconductor device 10 of FIG. 4 after a CMP process has been performed to remove excess material from the dielectric layer 40 as well as the polysilicon oxide 50 of the structures 28. The CMP process is selective for polysilicon and stops when the polysilicon layers 32b of the structures 28 and the polysilicon layers 30 of the structures 26 are exposed. Thus, the structures 26 and the structures 28 are exposed by the CMP process.

Figure 6:
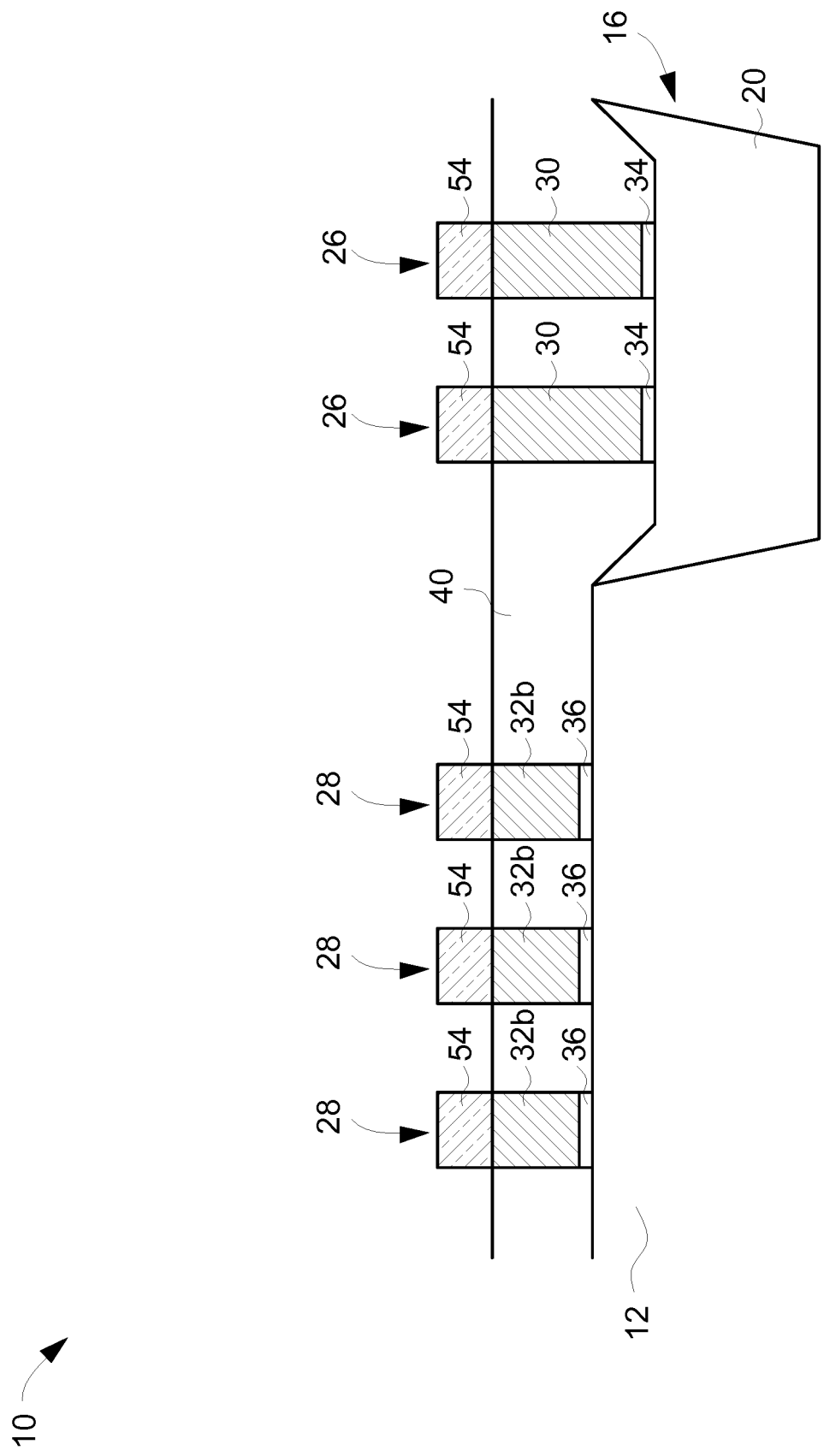
FIG. 6 is a cross-sectional view of an exemplary semiconductor device.

FIG. 6 shows the semiconductor device 10 of FIG. 5 after a silicide process has been performed. Silicide layers 54 are formed on the polysilicon layers 32b of the structures 28 and the polysilicon layers 30 of the structures 26, which were exposed during the silicide process. The silicide layers may be grown on the polysilicon layers and part of the polysilicon layers may be consumed and changed to silicide as part of the silicide process.

Figure 7:
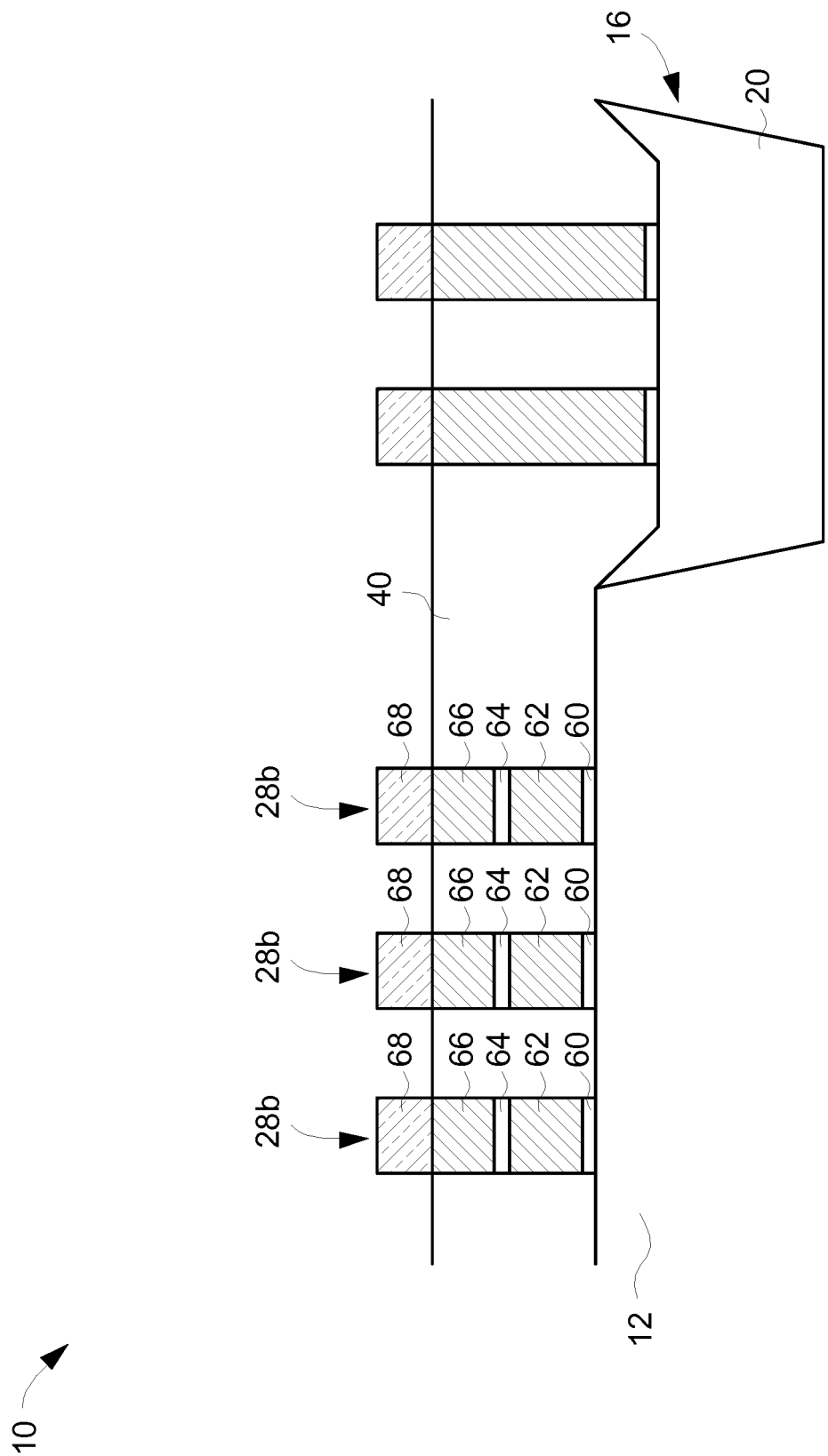
FIG. 7 is a cross-sectional view of an exemplary semiconductor device.
Figure 8:
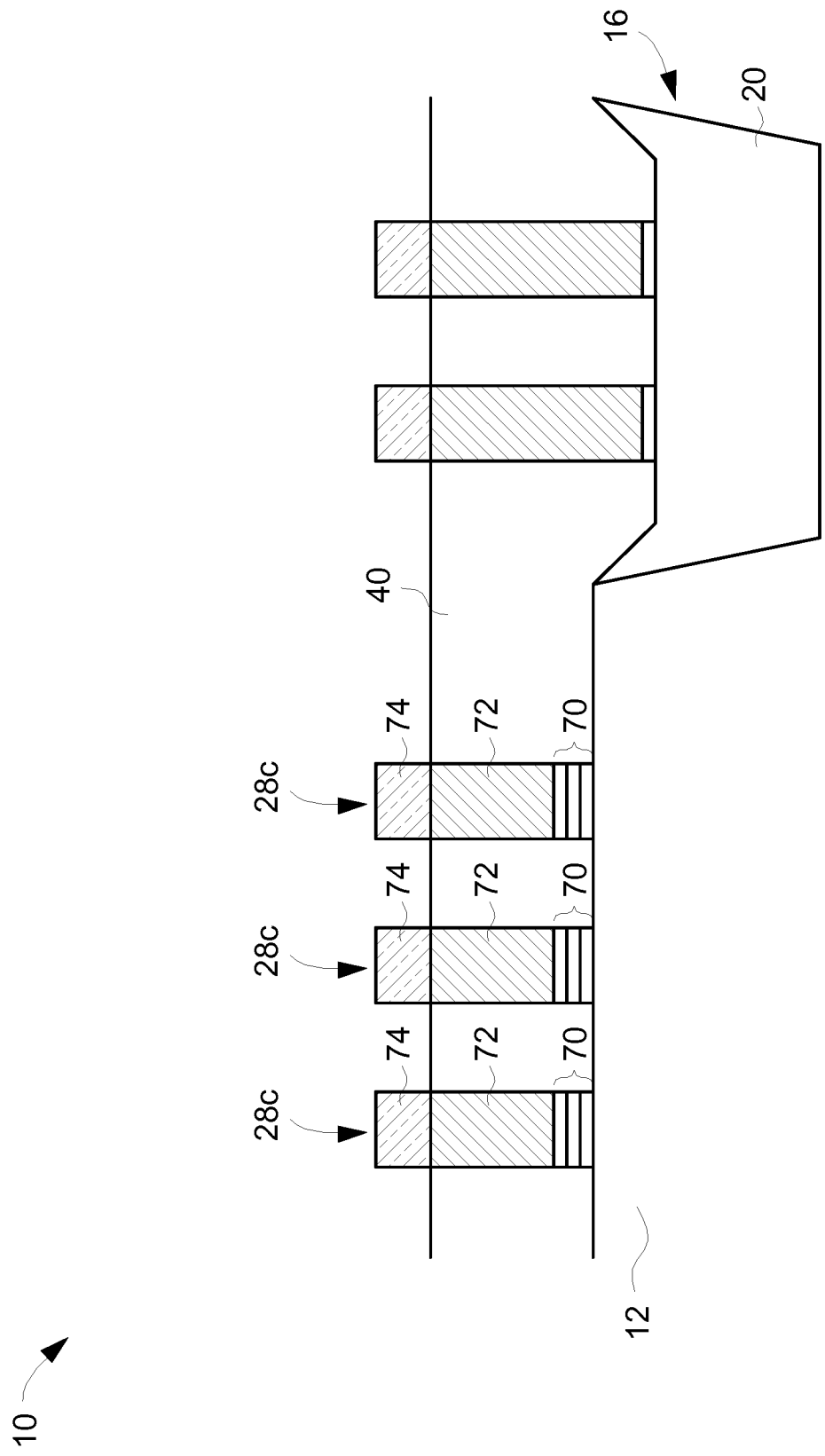
FIG. 8 is a cross-sectional view of an exemplary semiconductor device.

It will be appreciated that the structures 26 and 28 described above are merely exemplary and the discussed process may be used with any of a number of underlying structures and applications. As an example, the structures 26 and 28 of FIG. 4 may be used in a logic IC. As another example, FIG. 7 shows the structures 28b, which may be used in a memory, having polysilicon layers 62 formed over oxide layers 60. Oxide layers 60 may be tunneling layers. Dielectric layers 64, which may be laminated layers such as oxide-nitride-oxide (ONO) layers, are formed over the polysilicon layers 62. Second polysilicon layers 66 may be formed over the dielectric layers 64 and silicide layers 68 may be formed over the second polysilicon layers 66. As another example, FIG. 8 shows the structures 28c, which may be used in a memory such as a nitride read-only memory, having dielectric layers 70 formed over the substrate 12. The dielectric layers 70 may be laminated layers, such as ONO layers. Polysilicon layers 72 are formed over the dielectric layers 70. Silicide layers 74 may be formed over the polysilicon layers 72. As still another example, the structures described may also be formed on any semiconductor layer and do not have to be formed directly on a substrate.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A semiconductor device, comprising:
a substrate including a first region and a second region, the first region having a first surface, the second region having a second surface, the first surface in the first region being a surface of an isolation trench formed at a lower height than the second surface in the second region;
a first structure formed over the substrate on the first surface in the first region, the first structure having a silicide layer as a top layer, the silicide layer of the first structure formed over a polysilicon layer of the first structure, the silicide layer of the first structure and polysilicon layer of the first structure formed over the first surface of the first region, the first structure having a first height measured from the first surface of the first region to the silicide layer of the first structure;
a second structure formed over the substrate on the second surface in the second region, the second structure having a silicide layer as a top layer, the silicide layer of the second structure formed over a polysilicon layer of the second structure, the second structure having a second height measured from the second surface of the second region to the silicide layer of the second structure, the second height less than the first height; and
a dielectric structure formed over the substrate between the first structure and the second structure, the dielectric structure in contact with a side wall of the first structure and a side wall of the second structure;
wherein a height of the dielectric structure adjacent to the first structure is not more than the first height and a height of the dielectric layer adjacent to the second structure is not more than the second height;
wherein a top surface of the first structure is formed at the same height as a top surface of the second structure;
wherein a top surface of the dielectric structure is planar to the top surface of the first structure; and
wherein the height of the top surface of the dielectric structure adjacent to the first structure is formed at the same height as the height of the top surface of the dielectric structure adjacent to the second structure.

2. The semiconductor device of claim 1, wherein
the first and second structures include polysilicon layers, and
the first and second heights are heights of the respective polysilicon layers.

3. The semiconductor device of claim 1, wherein
the first region includes an isolation trench and the second region does not include an isolation trench,
the isolation trench is partially filled in with a fill-in material, and
the first structure is formed over the fill-in material.

4. The semiconductor device of claim 3, wherein the first height is 1.1 to 1.5 times the second height.

5. The semiconductor device of claim 3, wherein a surface of the fill-in material is not planar with a surface of the substrate in the second region.

6. The semiconductor device of claim 5, wherein the surface of the fill-in material is lower than the surface of the substrate in the second region.

7. The semiconductor device of claim 6, wherein the non-planar surface of the fill-in material exhibits a dishing effect.

8. The semiconductor device of claim 1, further comprising
an oxidized polysilicon layer formed over the second structure, the oxidized polysilicon having a third height, wherein
the second structure includes polysilicon, and
the second height plus the third height is the same as the first height.

9. A method of fabricating a semiconductor device, comprising:
providing a substrate including a first region and a second region, the first region having a first surface, the second region having a second surface, the first surface in the first region being a surface of an isolation trench formed at a lower height than the second surface in the second region;
forming a first structure over the substrate on the first surface in the first region, the first structure having a silicide layer formed as a top layer, the silicide layer of the first structure formed over a polysilicon layer of the first structure, the silicide layer of the first structure and polysilicon layer of the first structure formed over the first surface of the first region, the first structure having a first height from the first surface of the first region to the silicide layer of the first structure;
forming a second structure over the substrate on the second surface in the second region, the second structure having a silicide layer as a top layer, the silicide layer of the second structure formed over a polysilicon layer of the second structure, the second structure having a second height from the second surface of the second region to the silicide layer of the second structure, the second height less than the first height; and
forming a dielectric structure over the substrate between the first structure and the second structure, the dielectric structure in contact with a side wall of the first structure and a side wall of the second structure;
wherein a height of the dielectric structure adjacent to the first structure is not more than the first height and a height of the dielectric layer adjacent to the second structure is not more than the second height;
wherein a top surface of the first structure is formed at the same height as a top surface of the second structure;
wherein a top surface of the dielectric structure is planar to the top surface of the first structure; and
wherein the height of the top surface of the dielectric structure adjacent to the first structure is formed at the same height as the height of top surface of the dielectric structure adjacent to the second structure.

10. The method of claim 9, further comprising performing a processing step that reacts with the first and second structures.

11. The method of claim 10, wherein the processing step that reacts with the first and second structures is a silicide formation.

12. The method of claim 11, wherein the silicide formation forms a silicide layer over the first and second structures.

13. The method of claim 9, wherein
the substrate includes a trench,
the trench is at least partially filled in with a fill-in material,
the first structure is formed over the fill-in material, and
the second structure is formed over a region of the substrate not over the trench.

14. The method of claim 13, wherein the fill-in material exhibits a dishing effect.

15. The method of claim 13, wherein the first height is 1.1 to 1.5 times the second height.

16. The method of claim 9, further comprising
providing a third structure over the substrate in the second region;
forming a dielectric layer over the substrate and the first and third structures;
performing a planarization process to planarize the dielectric layer and expose the third structure, the planarization process not exposing the first structure; and
performing a processing step to change a material of an upper portion of the third structure to a different material, the second structure being provided by that portion of the third structure not changed to the different material.

17. The method of claim 16, further comprising performing a second planarization process to planarize the dielectric layer, the second planarization removing the portion of the third structure that has been changed to the different material.

18. The method of claim 17, wherein the second planarization exposes the first structure.

19. The method of claim 18, wherein the first and second structures are exposed by the second planarization.

20. The method of claim 16, wherein the processing step that changes the material of the upper portion of the third structure is an annealing step.

21. The method of claim 16, wherein the material of the first structure is polysilicon and the different material is oxidized polysilicon.

* * * * *